United States Patent
Chuang

(10) Patent No.: US 8,114,577 B2
(45) Date of Patent: Feb. 14, 2012

(54) METHOD FOR MAKING LIGHT BLOCKING PLATE

(75) Inventor: Hsin-Hung Chuang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 525 days.

(21) Appl. No.: 12/342,249

(22) Filed: Dec. 23, 2008

(65) Prior Publication Data
US 2010/0055622 A1 Mar. 4, 2010

(30) Foreign Application Priority Data
Aug. 27, 2008 (CN) .......................... 2008 1 0304233

(51) Int. Cl.
*G03F 7/26* (2006.01)
(52) U.S. Cl. ........................................ 430/315; 430/256
(58) Field of Classification Search .................. 430/311, 430/322, 256, 324, 329, 315, 320
See application file for complete search history.

(56) References Cited

U.S. PATENT DOCUMENTS
6,324,010 B1 11/2001 Bowen et al.
2006/0251972 A1 11/2006 Lee
2009/0131887 A1* 5/2009 Shiomitsu et al. ............ 604/272

FOREIGN PATENT DOCUMENTS
CN 101038445 A 9/2007

OTHER PUBLICATIONS
Rebecca J, Jackman et al., Using Elastomeric Membranes as Dry Resists and for Dry Lift-off, Langmuir 1999 vol. 15, P2073-2984, Published on Web Mar. 19, 1999.

* cited by examiner

*Primary Examiner* — Cynthia Kelly
*Assistant Examiner* — Caleen Sullivan
(74) *Attorney, Agent, or Firm* — Altis Law Group, Inc.

(57) ABSTRACT

An exemplary method for making a plurality of light blocking plates is provided. Firstly, a photoresist layer is formed on a substrate. Secondly, the photoresist layer is exposed using a gray scale photomask. Thirdly, the photoresist layer is developed to form a plurality of conical frustums on the substrate, and each of the conical frustums tapers in a direction away from the substrate. Fourthly, an opaque to-be-solidified film is formed on the substrate, and each of the conical frustums extends through the to-be-solidified film. Fifthly, the to-be-solidified film is solidified. Sixthly, the solidified film is separated from the substrate and the conical frustums, thus obtaining a light blocking plate module including a plurality of light blocking plates. Lastly, the light blocking plate module is cut into a plurality of individual light blocking plates.

8 Claims, 10 Drawing Sheets

METHOD FOR MAKING LIGHT BLOCKING PLATE

CROSS-REFERENCE TO RELATED APPLICATION

This application is related to the commonly-assigned copending application: Ser. No. 12/342,292, entitled "METHOD FOR MAKING LIGHT BLOCKING PLATE". The Disclosure of the above-identified application is incorporated herein by reference.

BACKGROUND

1. Technical Field

The present invention relates to a method for making the light blocking plate.

2. Description of Related Art

Nowadays, lens modules have been widely used in various portable electronic devices. The lens modules of portable electronic devices have become smaller and smaller in size. Accordingly, it is required that optical elements (e.g., a light blocking plate) used in the lens module have a smaller size/volume.

A typical light blocking plate is made by processing a plastic/metal tape. The thickness of the light blocking plate is limited by the thickness of the plastic/metal tape. The thickness of the light blocking plate is generally larger than 30 μm. Such a light blocking plate may not meet the demand for the miniature of the lens module.

Therefore, a new method for making the light blocking plate is desired to overcome the above mentioned problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below with reference to the drawings.

Figure 1:
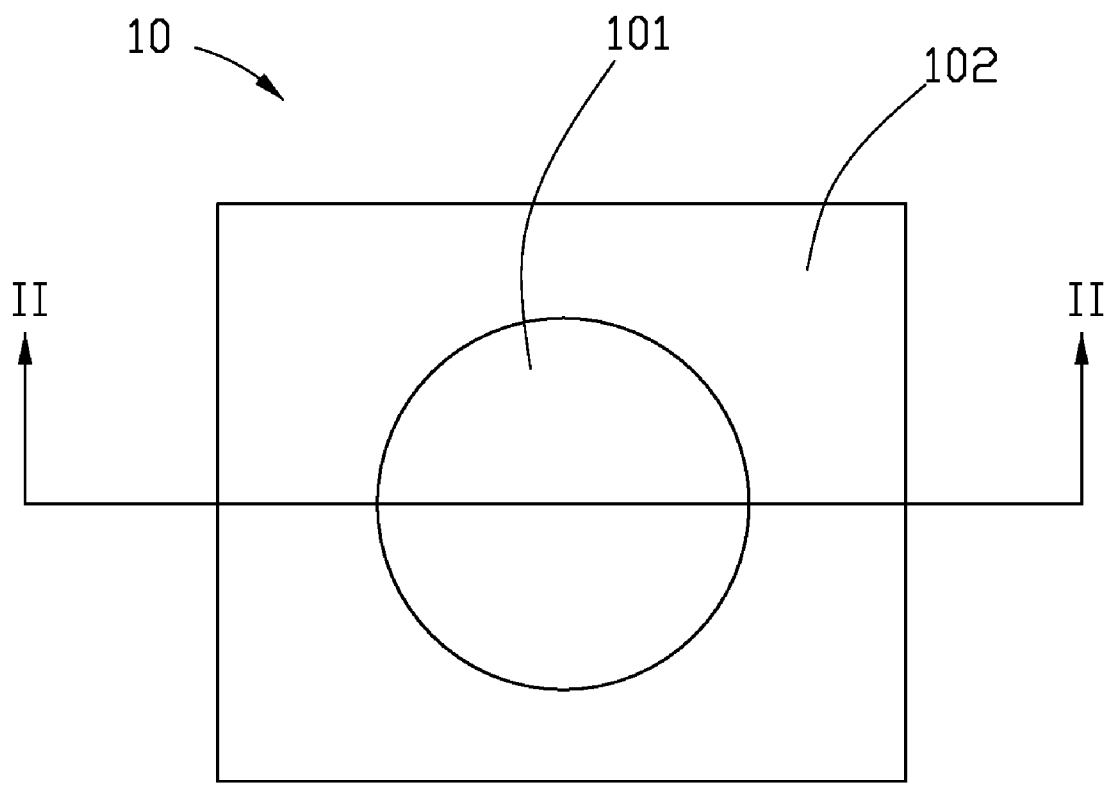
FIG. 1 is a schematic, plan view of a light blocking plate made by a method according to an exemplary embodiment.
Figure 2:
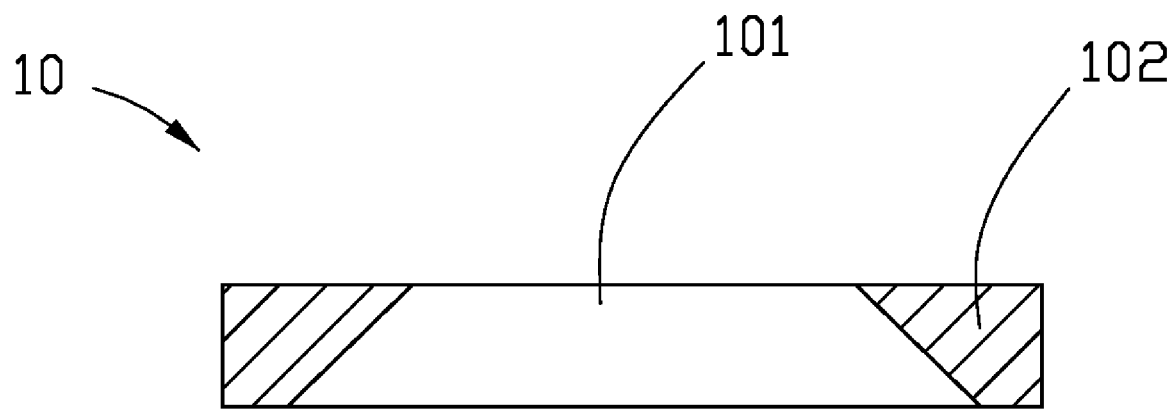
FIG. 2 is a schematic, cross-sectional view of the light blocking plate of FIG. 1 taken along the line II thereof.

Referring to FIGS. 1 and 2, a light blocking plate 10 made by a method according to an exemplary embodiment, is shown. The light blocking plate 10 includes a though hole 101 defined at the center and an opaque portion 102 surrounding the through hole 101. The light blocking plate 10 is comprised of a polydimethylsiloxane (PDMS) and a blackening agent. Because the PDMS is light pervious, a blackening agent is added to the PDMS to create the opaque effect to block light. The blackening agent can be a carbon black or a toluene. In addition, the light blocking plate 10 can be further comprised of a hardener.

A method for making the light blocking plate 10 will be described in detail as follows.

Figure 3:
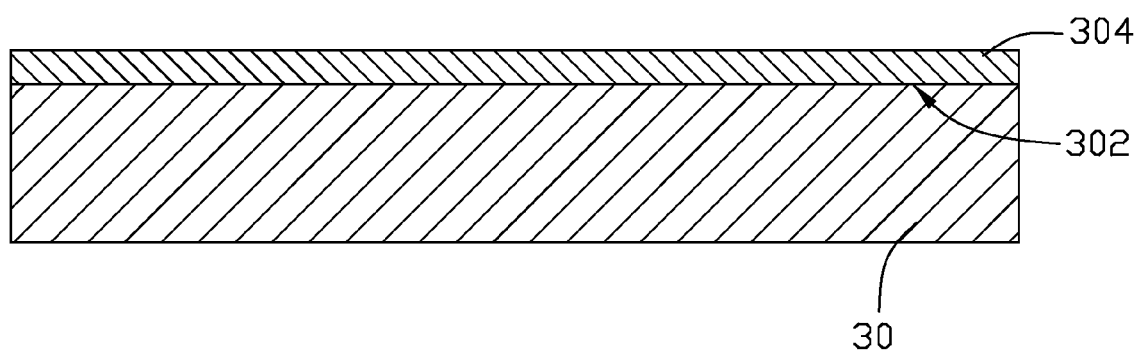
FIGS. 3-10 are schematic views showing successive stages of a method for making the light blocking plate shown in FIG. 1 according to the exemplary embodiment.

Referring to FIG. 3, a substrate 30 with a surface 302 is provided, and then a photoresist layer 304 is formed on the surface 302. The substrate 30 can be made of silicon. The potoresist layer 304 can be an epoxy-based negative photoresist (SU-8) layer.

Figure 4:
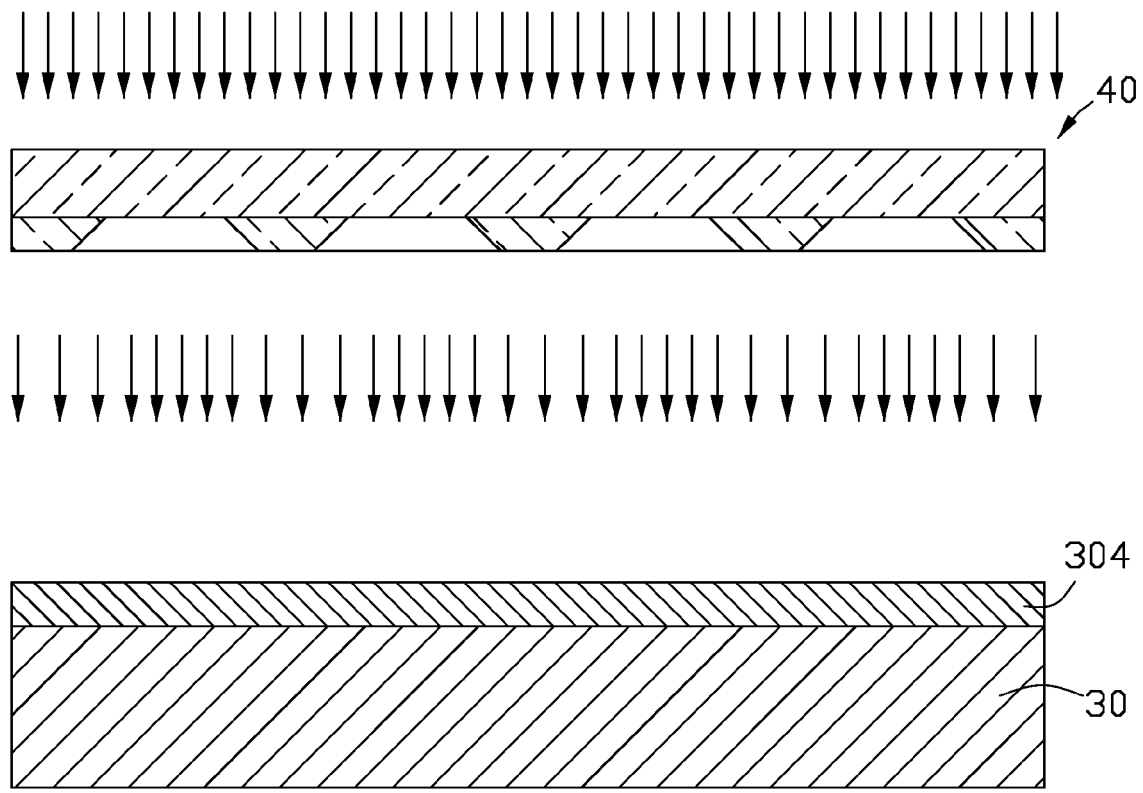

Referring to FIG. 4, the photoresist layer 304 is exposed to an ultraviolet light through a gray scale photomask 40 with a predetermined pattern.

Figure 5:
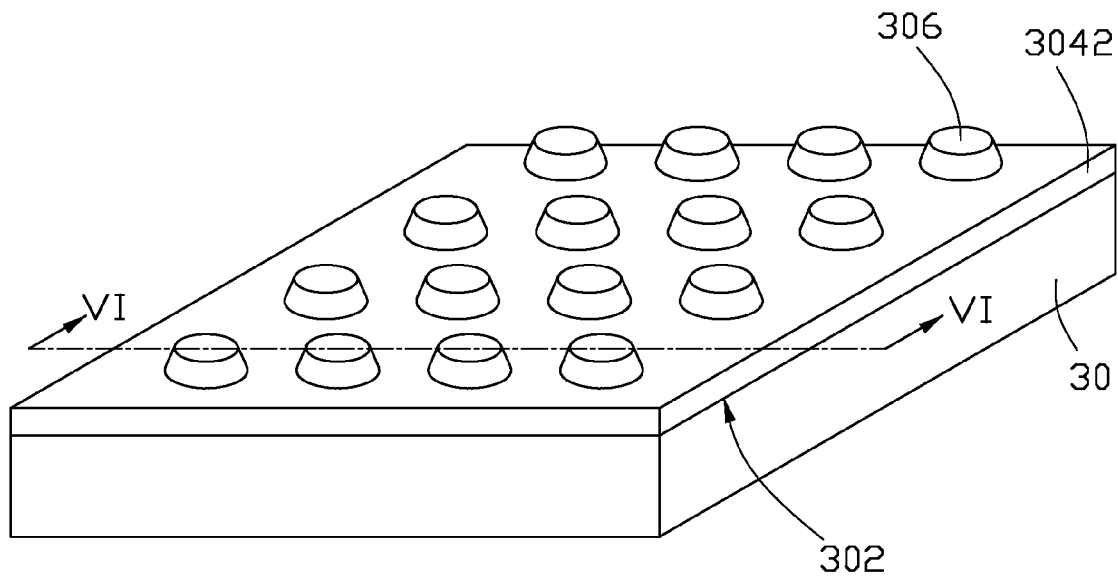
Figure 6:
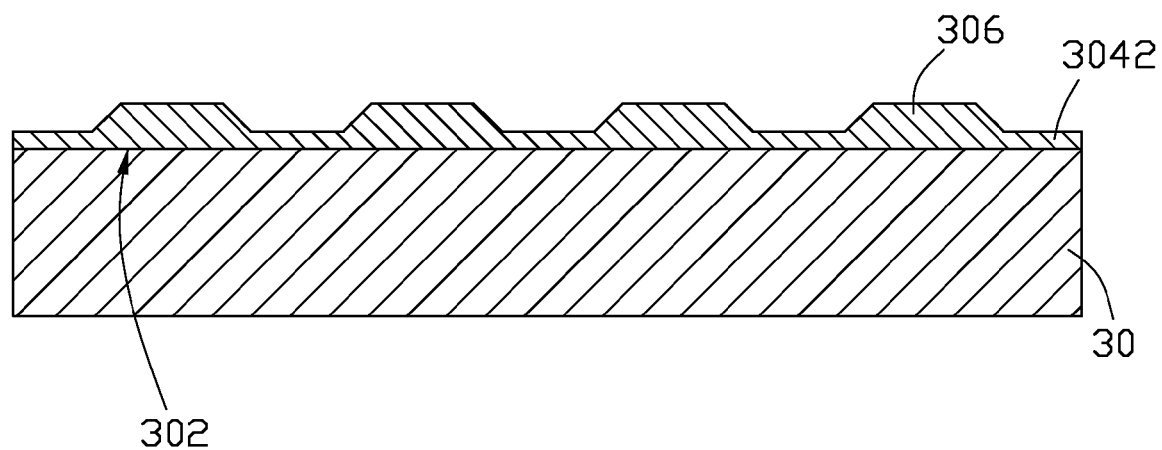
Figure 7:
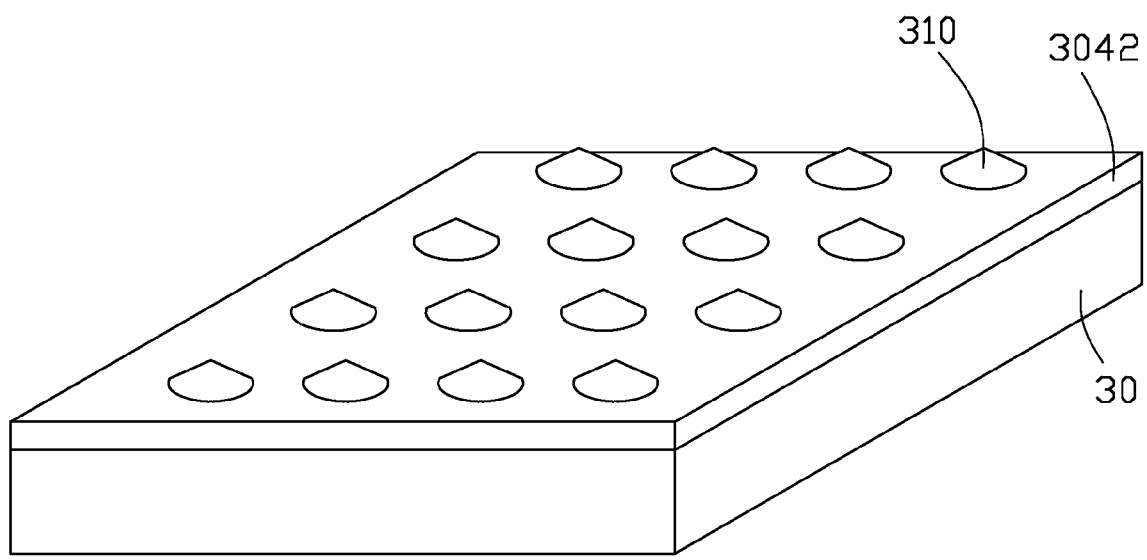

Referring to FIGS. 5 and 6, the photoresist layer 304 is developed to form a plurality of conical frustums 306. At the same time, an exposed photoresist layer 3042 remains on the surface 302 of the substrate 30. Each conical frustum 306 tapers in a direction away from the substrate 30. Each conical frustum 306 extends in a direction substantially perpendicular to the surface 302 of the substrate 30. Alternatively, a plurality of cones 310 instead of conical frustums 306 can be formed on the substrate 30 using the same process, as shown in FIG. 7.

Figure 8:
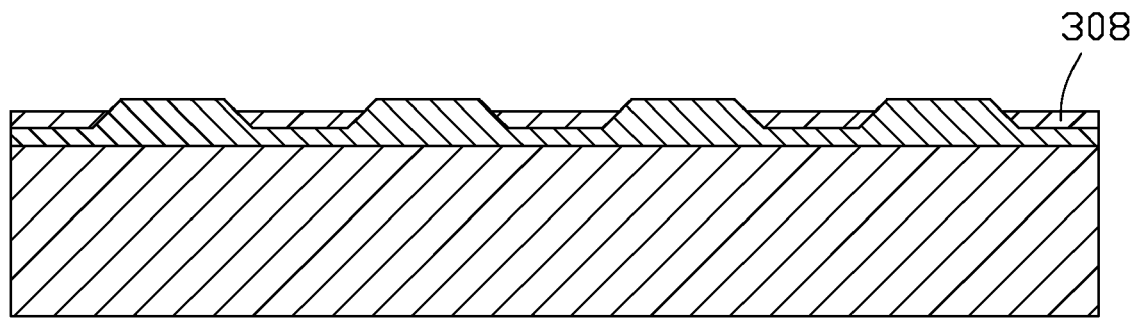

Referring to FIG. 8, an opaque to-be-solidified film 308 is formed on the exposed photoresist layer 308, and then solidified. The to-be-solidified film 308 can be comprised of a PDMS, a blackening agent and a hardener. The thickness of the to-be-solidified film 308 should be less than the height of each conical frustum 306 so that each conical frustum 306 extends through the to-be-solidified film 308. The to-be-solidified film 308 can be formed by spin coating. In spin coating process, the thickness of the to-be-solidified film 308 can be effectively controlled.

Figure 9:
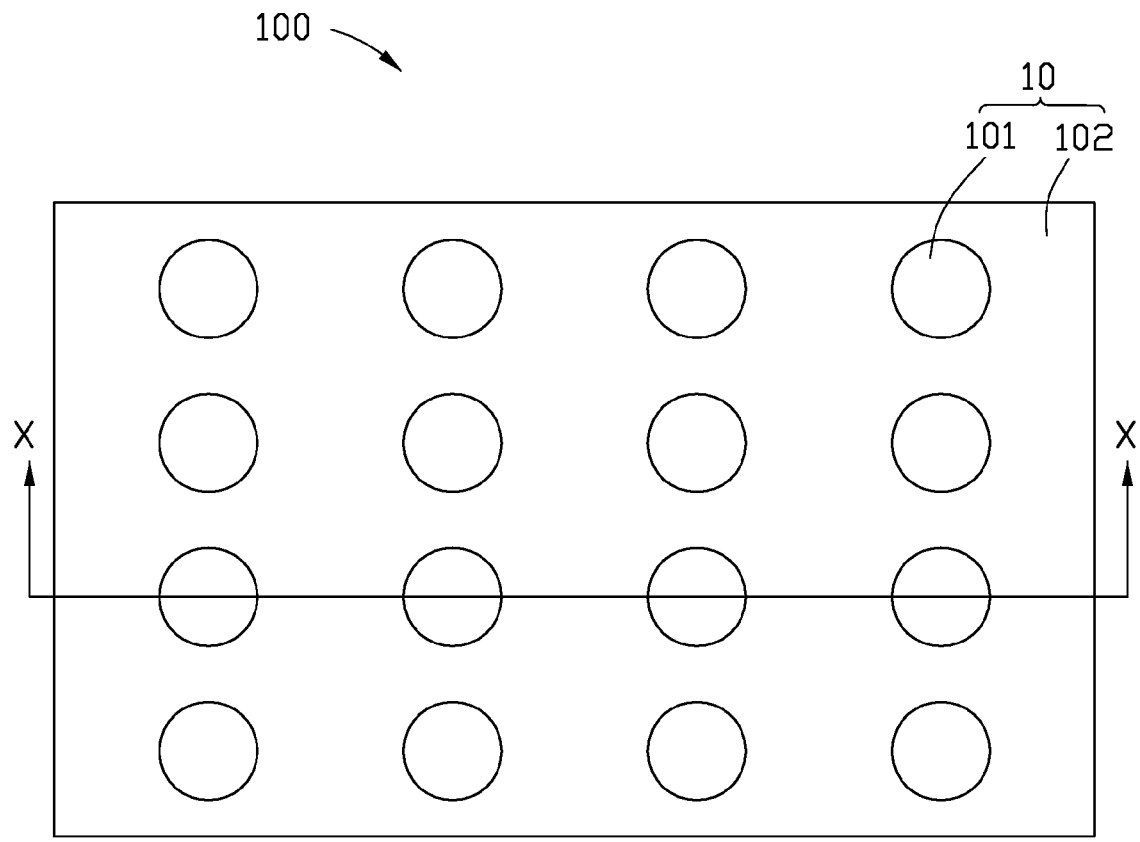
Figure 10:
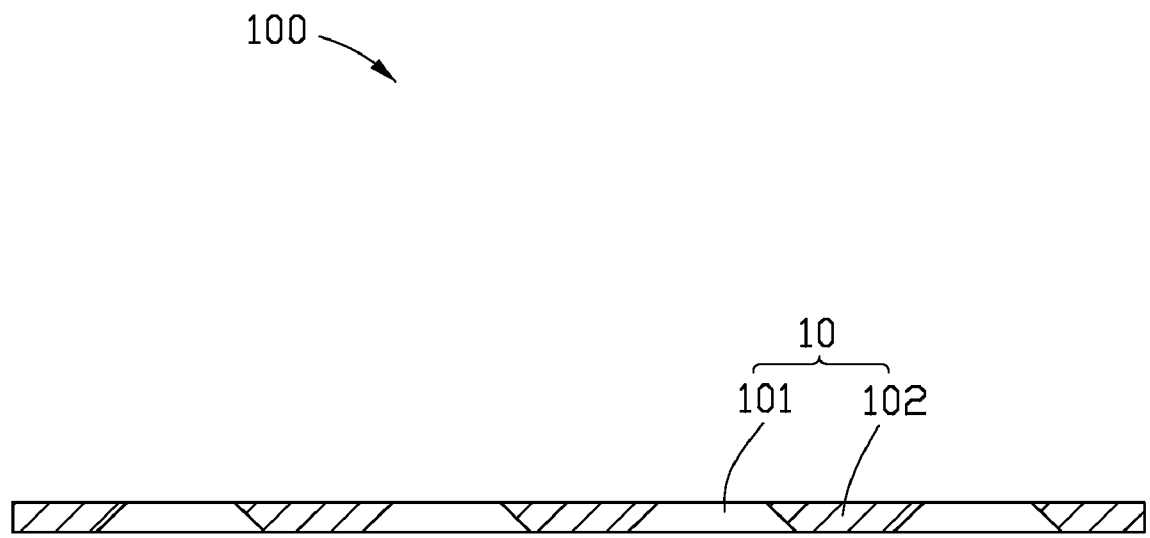

Sequentially, the substrate 30 is turned over, and then the solidified film 308 is separated from the substrate 30 and the conical frustums 306, thus obtaining a light blocking plate module 100 including a plurality of light blocking plates 10 (see FIGS. 9-10). Each light blocking plate 10 includes a through hole 101 corresponding the respective conical frustum 306.

Lastly, the light blocking plate module 100 is divided/cutting into a plurality of light blocking plates 10, one of which is shown in FIGS. 1-2.

In the above method, the thickness of the light blocking plate 10 is determined by the thickness of the film 308. By controlling the thickness of the film 308, a light blocking plate 10 having a small thickness can be achieved. Particularly, in spin coating process, the thickness of the film 308 to be formed can be effectively controlled.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope of the appended claims.

What is claimed is:

1. A method for making a plurality of light blocking plates, the method comprising:

forming a photoresist layer on a substrate;

exposing the photoresist layer using a gray scale photomask;

developing the photoresist layer to form a plurality of conical frustums on the substrate, each of the conical frustums tapering in a direction away from the substrate;

forming an opaque film on the substrate, each of the conical frustums extending through the film;

solidifying the film;

separating the solidified film from the substrate and the conical frustums, thus obtaining a light blocking plate module comprising a plurality of light blocking plates each having a through hole corresponding to the respective conical frustum; and cutting the light blocking plate module into a plurality of individual light blocking plates.

2. The method of claim 1, wherein a height of each conical frustum relative to the substrate is greater than a thickness of the film.

3. The method of claim 1, wherein the film is comprised of a blackening agent and a polydimethylsiloxane (PDMS).

4. The method of claim 1, wherein the to-be-solidified film is further comprised of a hardener.

5. A method for making a plurality of light blocking plates, the method comprising:

forming a photoresist layer on a substrate;

exposing the photoresist layer using a gray scale photomask;

developing the photoresist layer to form a plurality of cones on the substrate, each of the cones tapering in a direction away from the substrate;

forming an opaque film on the substrate, each of the cones extending through the film;

solidifying the film;

separating the solidified film from the substrate and the cones, thus obtaining a light blocking plate module comprising a plurality of light blocking plates each having a through hole corresponding to the respective cone; and cutting the light blocking plate module into a plurality of individual light blocking plates.

6. The method of claim 5, wherein a height of each cone relative to the substrate is greater than a thickness of the film.

7. The method of claim 5, wherein the film is comprised of a blackening agent and a PDMS.

8. The method of claim 5, wherein the film is further comprised of a hardener.

* * * * *